United States Patent [19]

Agarwala et al.

[11] Patent Number: 4,985,310

[45] Date of Patent: Jan. 15, 1991

[54] MULTILAYERED METALLURGICAL STRUCTURE FOR AN ELECTRONIC COMPONENT

[75] Inventors: Birendra N. Agarwala, Wappingers Falls; Keith F. Beckman, Wallkill; Alice H. Cooper-Joselow, Pleasantville; Chandrasekhar Narayan, Beacon; Sampath Purushothaman, Yorktown Heights; Sudipta K. Ray, Wappingers Falls, all of N.Y.

[73] Assignee: International Business Machines Corp., Armonk, N.Y.

[21] Appl. No.: 405,418

[22] Filed: Sep. 5, 1989

Related U.S. Application Data

[63] Continuation of Ser. No. 179,330, Apr. 8, 1988, abandoned.

[51] Int. Cl.$^5$ ............................................. H01L 29/14
[52] U.S. Cl. .................................. 428/620; 428/621; 428/651; 428/660; 428/667; 428/672; 428/675
[58] Field of Search ............... 428/620, 621, 627, 632, 428/651, 652, 660, 667, 670, 672, 673, 675

[56] References Cited

U.S. PATENT DOCUMENTS

| Re. 27,934 | 3/1974 | Merrin et al. | 317/101 CC |
| 3,982,908 | 9/1976 | Arnold | 29/195 |
| 4,065,588 | 12/1977 | Arnold | 427/89 |
| 4,463,059 | 7/1984 | Bhattacharya et al. | 428/620 |
| 4,675,243 | 6/1987 | Obinata et al. | 428/660 |

*Primary Examiner*—Theodore Morris
*Assistant Examiner*—George Wyszomierski
*Attorney, Agent, or Firm*—Ira David Blecker

[57] ABSTRACT

Disclosed is a multilayered metallurgical structure for an electronic component. The structure includes a base metallurgy which includes one or more layers of chromium, titanium, zirconium, hafnium, niobium, molybdenum, tantalum, cooper and/or aluminum. Directly on the base metallurgy is a layer of cobalt. The structure may also include a layer of noble or relatively noble metal such as gold, platinum, palladium and/or tin directly on the cobalt.

16 Claims, 1 Drawing Sheet

MULTILAYERED METALLURGICAL STRUCTURE FOR AN ELECTRONIC COMPONENT

This application is a continuation of application Ser. No. 179,330, filed Apr. 8, 1988, now abandoned.

BACKGROUND OF THE INVENTION

The present invention relates to the packaging of chips and, more particularly, relates to an improved metallurgical structure for joining a chip to a substrate and for making engineering changes.

On the top surface of a semiconductor chip, there is an arrangement of chip pads, each with a solder ball (hereafter referred to as C-4 solder ball pads or just C-4s) which are adapted to provide connection between the chips and a ceramic substrate by means of bonding of the solder balls which are heated to a temperature above the melting temperature of the solder balls thereby permitting solder bonding of the solder balls to the pads carried on the upper surface of the substrate. Connected between the solder pad areas and other sites on or in the substrate are so-called fan-out lines which extend along the top surface of the substrate beneath a layer of insulation. At certain locations on the surface of the substrate, it is necessary to make pads available for engineering change wiring to be connected to the fan-out metallurgy. The engineering change wiring, however, is usually connected to the pads by the process of wire bonding, either by ultrasonic vibration or by thermo-compression techniques, although solder bonding has also been proposed. The metallurgical requirements for solder bonding as contrasted with the requirements for wire bonding techniques differ.

In Bhattacharya et al. U.S. Pat. No. 4,463,059, the disclosure of which is incorporated by reference herein, the metallurgical requirements for solder bonding and wire bonding are discussed in the context of the top surface metallurgy of a ceramic substrate. Several metallurgical structures are proposed. For solder bonding, one proposed structure consists of fan-out lines of chromium and gold, then a barrier layer of cobalt or chromium over the gold followed by a top layer of nickel or copper. For wire bonding, the nickel or copper top layer is eliminated. In other structures, Bhattacharya et al. suggests the use of gold where solder bonding is to occur.

Merrin et al. U.S. Pat. Re. 27,934 discusses the requirements of ball limiting metallurgy, i.e. the pads on the bottom of the chip which serve to limit the flow of the solder balls upon heating. The particular ball limiting metallurgy proposed by Merrin et al. comprises subsequent layers of chromium, copper and then gold. Similarly, Research Disclosure 267026 discloses a ball limiting metallurgy comprising subsequent layers of chromium or titanium, nickel or copper followed by a top layer of gold. The disclosures of both of these references are incorporated by reference herein.

Arnold U.S. Pat. Nos. 3,982,908 and 4,065,588, the disclosures of which are incorporated by reference herein, both disclose metallurgical structures for silicon devices comprising subsequent layers of nickel, gold and cobalt or gold and cobalt, respectively.

The present day top surface metallurgy for ceramic substrates may comprise a multilayered metallurgical structure of chromium or titanium, copper and then gold or, alternatively, molybdenum, nickel and then gold. The currently favored ball limiting metallurgy comprises chromium, copper and gold. Both the top surface metallurgy (hereinafter TSM) and the ball limiting metallurgy (hereinafter BLM) undergo many solder reflow operations during the process of joining the chips to the ceramic substrate. The gold in the TSM and BLM quickly dissolves in the solder, leaving the underlying copper (or nickel) to react with the solder which is usually of a lead/tin composition. The solder and the underlying copper (or nickel) have been chosen because they form a good solder joint.

The reaction of the copper and the solder, however, causes the formation of copper/tin intermetallics. Ordinarily, this would not be a problem but due to the multiple solder reflows necessary to join the chips to the ceramic substrate, the copper/tin intermetallics, eventually build up to the point where they spall off the underlying metallization, resulting in the loss of BLM conduction as well as the loss of a reaction barrier between the solder and the underlying chip metallization. Further, the spalling of these intermetallics can lead to early failure of the solder joint, an undesirable circumstance.

It would thus be an important step to be able to eliminate copper/tin intermetallics and their accompanying problems.

Accordingly, it is an object of the invention to have an improved joint between electronic components which is not as susceptible to excessive formation of intermetallics and their accompanying problems.

It is another object of the invention to have an improved joint between electronic components comprising a metallurgical structure which has a reduced rate of reaction with solder.

It is yet another object of the invention to have an improved joint between electronic components after multiple solder reflows.

These and other objects of the invention will become more apparent after referring to the following description considered in conjunction with the accompanying drawings.

BRIEF SUMMARY OF THE INVENTION

According to one aspect of the invention there is disclosed a multilayered metallurgical structure for an electronic component. The structure comprises a base metallurgy, a layer of cobalt directly on the base metallurgy, and a layer of noble or relatively noble metal directly on the layer of cobalt.

According to another aspect of the invention there is disclosed a solder-contacted multilayer metallurgical structure for an electronic component. The structure comprises a base metallurgy, a layer of cobalt directly on the base metallurgy, and a layer of noble or relatively noble metal directly on the layer of cobalt. The metallurgical structure is contacted with a quantity of solder.

According to a final aspect of the invention, there is disclosed a multilayered metallurgical structure for an electronic component. The structure comprises a base metallurgy which comprises one or more layers of chromium, titanium, copper, aluminum, tantalum, zirconium, hafnium, niobium and/or molybdenum. Directly on the base metallurgy is a layer of cobalt. The structure may also comprise a layer of noble or relatively noble metal directly on the cobalt.

DETAILED DESCRIPTION OF THE INVENTION

Figure 1:
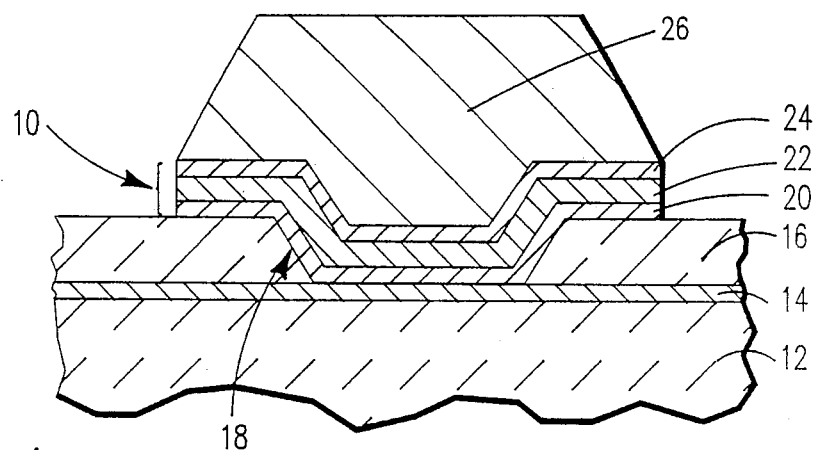
FIG. 1 is a cross-sectional view of a multilayered metallurgical structure according to the invention.

Referring to the Figures in more detail and particularly referring to FIG. 1 there is shown a multilayered metallurgical structure, generally indicated by 10, for an electronic component 12. In this case the electronic component is a silicon device such as a semiconductor chip. On top of the electronic component 12 is a layer of metallurgy 14. By way of illustration and not limitation the metallurgy 14 may be an aluminum/copper alloy, aluminum, copper or gold. Thereafter, a layer of insulator 16 such as glass, quartz, silicon nitride, silicon oxynitride or organic insulators such as polyimide (hereafter just insulator) is deposited over the metallurgy 14. The insulator 16 is etched through to provide contact with metallurgy 14. The walls 18 of the insulator 16 provide a containment area for the ball limiting metallurgy to be deposited subsequently.

The multilayer metallurgical structure which in this case is a ball limiting metallurgy (BLM) is now deposited on the insulator layer 16 as follows. First base metallurgy 20 is deposited on the insulator 16. Cobalt layer 22 is then deposited directly on base metallurgy 20 followed by a layer of noble or relatively noble metal 24 deposited directly on the layer of cobalt 22. Finally, a quantity of solder 26 is deposited over noble or relatively noble metal layer 24.

It should be understood that noble or relatively noble metal means those metals and alloys that have a reduced tendency to oxidize in air. Included within this definition are true noble metals such as gold, platinum and palladium, and also other metals having a reduced tendency to oxidize in air such as tin. The use of the term noble metal shall hereafter encompass noble as well as relatively noble metals.

Thereafter, the multilayer metallurgical structure 10 and electronic component 12 are heated to cause the solder 26 to melt and flow as taught by the Merrin et al. patent mentioned previously. The BLM 10 and insulator 16 serve to contain the solder and limit its flow.

It is preferred that base metallurgy 20 in direct contact with the cobalt layer 22 be either titanium or chromium but could also be tantalum, zirconium, niobium hafnium or molybdenum. It is further preferred that the noble metal layer 24 be gold but, alternatively could also be platinum, palladium or tin. It is further preferred that the titanium or chromium layer have a thickness of 0.01–0.3μ, the cobalt layer have a thickness of 0.2–0.5μ, and the gold layer have a thickness of 0.1–0.2μ.

During the reflow operation the noble layer 24 becomes absorbed within the solder 26 and thus is considered to be a fugitive layer. The importance of the noble layer resides in the fact that it prevents the underlying cobalt layer from oxidizing during storage.

Cobalt is an important ingredient of the invention for several reasons. First, cobalt forms a strong bond with either the chromium or titanium underlayer. For example, cobalt is somewhat soluble in chromium such that a solid solution bond with the chromium forms. With respect to the titanium, there is a cobalt/titanium intermetallic phase that forms and which acts as a stable metallurgical bond to anchor the cobalt to the titanium. It is thus expected that spalling of the cobalt from either of the chromium or titanium would not occur. Additionally, and perhaps most importantly, the cobalt has limited reactivity with the solder. This reactivity is several orders of magnitude less than for copper. It is thus expected that the cobalt layer will be able to undergo multiple solder reflows without exhibiting any deleterious qualities such as spalling.

An unexpected advantage of the cobalt is that the cobalt forms a thin layer of intermetallic that is adherent with the solder and the underlying cobalt. The intermetallic is believed to be cobalt/tin. During reflow and rework operations, this intermetallic is wettable by the solder so that fluxing may be dispensed with if desired.

Figure 2:
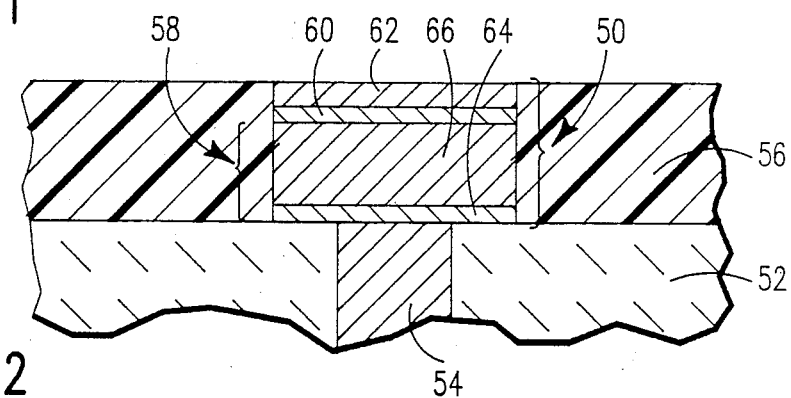
FIG. 2 is a cross-sectional view of another embodiment of a multilayered metallurgical structure according to the invention.

Referring now to FIG. 2, there is shown a further embodiment of the invention. In FIG. 2 there is shown a multilayered metallurgical structure generally indicated by 50 for an electronic component 52. In this case the electronic component 52 is a multilayered ceramic substrate and the multilayered metallurgical structure 50 is top surface metallurgy (TSM). Within the ceramic substrate 52 there is a via 54 for communicating between the wiring in the various layers (not shown) of the ceramic substrate and the TSM 50. The TSM 50 may serve the purpose of a C-4 pad for joining with the solder 26 shown in FIG. 1. In this case TSM 50 will join with BLM 10 through solder 26 so as to interconnect chip 12 with substrate 52. Alternatively, TSM 50 may serve the purpose of a wire bonding site for an engineering change pad in which case the TSM 50 may not come in contact with solder. For example, wire bonding may be done by ultrasonic vibration or thermo compression, in which case solder is not used.

The structure shown in FIG. 2 may be formed in a number of ways, but one particular way is to first deposit a layer of insulating material 56, for example a polyimide. By photolithography and etching the polyimide is removed in the area over via 54. Thereafter, the multilayer metallurgical structure 50 is deposited. There is first deposited a base metallurgy 58 shown enclosed by brackets. Thereafter a layer of cobalt 60 is deposited on the base metallurgy 58 followed by a layer of noble metal 62, preferably gold, which is deposited directly on the layer of cobalt 60.

In practice if the multilayer metallurgical structure 50 was to come in contact with solder the noble metal layer 62 would dissolve into the solder during the reflow operation. Accordingly, the noble metal layer 62 would be fugitive. On the other hand if the multilayer metallurgical structure 50 was only to undergo wire bonding, where soldering was not to occur, then noble metal layer 62 would remain substantially in place.

It is preferred that the base metallurgy 58 comprises first a layer of adhesive metallization 64 such as titanium, chromium, niobium, tantalum, zirconium, hafnium or molybdenum. The base metallurgy 58 is in contact with substrate 52 and via 54 followed by a conductive layer 66 which could consist of copper, aluminum or alloys thereof. Thereafter the cobalt 60 is deposited directly on the copper 66 followed by deposition of noble metal layer 62. The titanium or chromium, copper and cobalt will then form a part of the top surface metallurgy of the ceramic substrate 52. Thicknesses of each of the layers may be: titanium or chromium (0.02–0.05μ), copper (5–6μ), cobalt (0.5–2.0μ) and gold (0.01–0.25μ).

Base metallurgy 58 may also be more complex. In this case layer 64 may actually comprise three layers of chromium (0.02–0.1μ), copper (2–3μ) and chromium (0.02–0.05μ). Layer 66 will again be copper (4–6μ) followed by cobalt (0.5–2.0μ) and gold (0.01–0.25μ).

Cobalt is again selected as the preferred material as the layer over the copper because of its relatively reduced reactivity with the solder. Further, copper forms a solid solution bond with the cobalt so that the cobalt will remain firmly adhered and bonded to the copper. Therefore, spalling of the cobalt will not be a problem. On the other hand, since cobalt has only limited solubility in copper it is expected that the cobalt will not diffuse very much into the copper, thereby avoiding any substantial increase in the resistivity of the copper.

The advantages of the present invention will become more apparent after referring to the following examples.

EXAMPLES GROUP I

Figure 3:
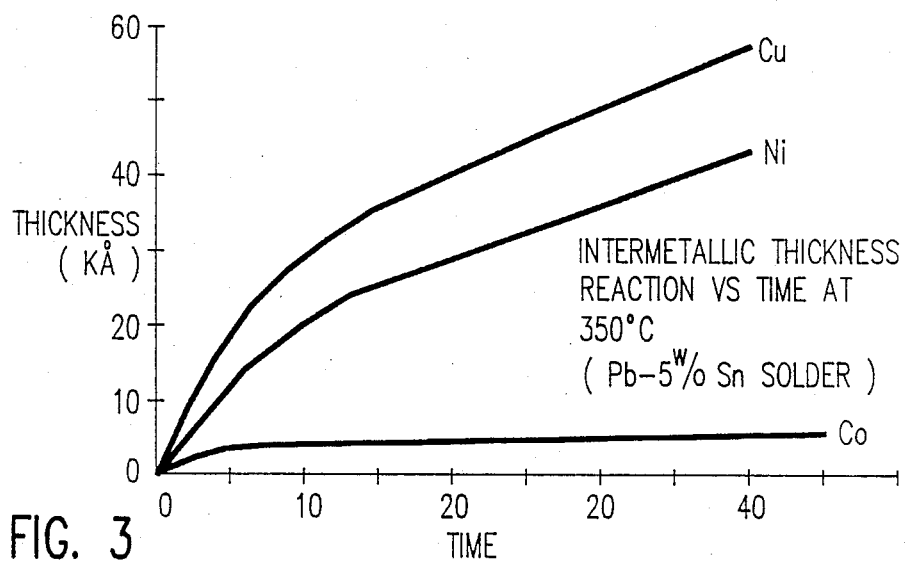
FIG. 3 is a graph illustrating the reactivity of solder with copper, nickel and cobalt.

Groups of copper, nickel and cobalt thick foils were prepared. Solder (95 w/o Pb-5 w/o Sn) was applied to each of the foils. The foils were then exposed to 350° C. (the approximate solder reflow temperature) for various periods of time. The foils were then sectioned and the thickness of the intermetallics formed between the metal (copper, nickel or cobalt) and the solder measured. The results were plotted on a graph of thickness of the intermetallic formed versus time as illustrated in FIG. 3.

The reaction kinetics data generated clearly shows that the reaction rate of cobalt with the solder is much less than that of copper or nickel. As an example, 1 micron thick intermetallic phase forms for copper, nickel and cobalt at 1.1, 2 and 113 minutes, respectively. Since in multiple device joining operations used in the manufacture of ceramic substrates the total duration of time the solder is in this molten stage is between 3 and about 45 minutes, it is expected that the cobalt will form an intermetallic layer with a thickness less than about 0.5 microns. Accordingly, it is expected that spalling of the cobalt layer would not occur and good conductivity of the metallization layer would be maintained after reaction with the solder. The proposed BLM and TSM would thus provide an excellent diffusion barrier between the solder and the underlying metallization.

EXAMPLES GROUP II

Forty five test chips, each having 121 C-4 solder ball pads, were obtained. Each of the C-4 solder ball pads on each of the chips were fabricated with a ball limiting metallurgy as shown in FIG. 1. In 15 of the chips, the base metallurgy 20 was titanium (0.23μ) followed by a cobalt layer 22 (0.5μ) and a top layer 24 of gold (0.1μ).

In the next 15 chips, the base metallurgy 20 was chromium (0.23μ) followed by the cobalt layer 22 (0.5μ) and the gold layer (0.1μ). As a control, 15 chips were prepared having a base metallurgy 20 of chromium (0.23μ), an intermediate layer 22 of copper (0.5μ) and a top layer 24 of gold (0.1μ). All 45 of the chips contained a quantity of solder 26 (97 w/o Pb-3 w/o Sn).

In the case of the Ti-Co-Au and the Cr-Co-Au metallurgies, the last 200 Å of the titanium or chromium were phased in with 200 Å of the cobalt to increase the bonding. While this is a preferred mode of deposition, it is not absolutely necessary since titanium or chromium already form a metallurgical bond with cobalt. With respect to the Cr-Cu-Au, however, this phasing in of the chromium and copper is absolutely necessary for adhesion since they do not form a metallurgical bond.

The chips were then joined to a multilayer ceramic substrate having conventional Mo-Ni-Au TSM.

The pull strength at room temperature for each of the chips was then measured. The pull strength of half of each group of chips was measured after joining and the pull strength of the other half of each group of chips was measured after 20 solder reflows. The results are summarized in Table I below

TABLE I

| | CHIP PULL DATA | |
|---|---|---|
| BLM TYPE | PULL STRENGTH, lb. (as joined) | PULL STRENGTH, lb. (after 20 reflows) |
| Ti—Co—Au | 18.8 | 15.3 |
| Cr—Co—Au | 17.6 | 14.6 |
| Cr—Cu—Au | 18.4 | 15.3 |

These results indicate that the pull strength for both Ti-Co-Au and Cr-Co-Au BLM is comparable to the pull strength of the Cr-Cu-Au control group.

The pulled samples were examined by a scanning electron microscope (SEM) after etching off the solder. With respect to the Cr-Cu-Au BLM, it was observed that in those samples that had undergone multiple reflows, the Cu-Sn intermetallics that had formed during the soldering operation had grossly spalled off from the weakly bonded chromium surface. In contrast with the Cr-Cu-Au BLM, no such spalling was observed with the SEM on the Cr-Co-Au and Ti-Co-Au BLM structures.

Further metallography verified that the Cr-Co and Ti-Co metallurgies remain intact at the original interface even after 20 reflows. The gold layer, of course, is fugitive and disappears early on in the soldering process. This metallography also revealed the presence of unreacted cobalt adjacent to the titanium or chromium base metallurgy, underneath a thin surface layer of Co-Sn intermetallics.

The presence of the unreacted cobalt is important for a number of reasons. The unreacted cobalt is an excellent diffusion barrier and thus prevents the unwanted diffusion of gold and solder into the underlying metallization.

The unreacted cobalt is also important in that it provides conductivity for the BLM. When spalling occurs, as in the case of the Cr-Cu-Au BLM, the conductive path is across and through the chromium layer, which increases the resistance of the joint due to the poor conductivity of the chromium. If unreacted cobalt is present, conduction across the BLM is much improved, thereby leading to a lower resistance joint.

In sum, the proposed BLM provides a joint having mechanical strength equivalent to that of the presently used Cr-Cu-Au metallurgy, but is superior in its ability to maintain good BLM conduction and a solder reaction barrier.

EXAMPLES GROUP III

Ceramic substrates similar to that shown in FIG. 2 were provided for receiving chips having C-4's and Cr-Cu-Au ball limiting metallurgy. The substrates had a TSM comprising a layer 64 of titanium (0.3μ) a layer 66 of copper (5μ), a layer 60 of cobalt (1μ) and a layer 62 of gold (0.25μ).

Chip pull strength was measured at room temperature after initial joining, 10 solder reflows and 15 solder reflows. The results are tabulated below.

TABLE II

| | CHIP PULL DATA | | |
|---|---|---|---|
| TSM TYPE | Pull Strength (lb) (as joined) | Pull Strength (lb) (after 10 reflows) | Pull Strength (lb) (after 15 reflows) |
| Ti—Cu—Co—Au | 19 | 16.7 | 15.7 |

This compares favorably with the 15–19 lbs. chip pull strength which is normally measured for conventional Mo-Ni-Au TSM.

Additional ceramic substrates were prepared. With these ceramic substrates, however, the TSM comprised chromium (0.02μ), copper (2μ) and chromium (0.01μ) as layer 64, copper (4μ) as layer 66, cobalt (1μ) as layer 60 and gold (0.25μ) as layer 62.

To each of the ceramic substrates, wires were ultrasonically bonded to the TSM so as to simulate wire bonding to an EC pad. The wire-bonding was done in the as-deposited condition and after the substrates underwent a simulated processing scheme including 15 chip join cycles. Each of the wires of the wire bonds was pulled and then examined.

The results indicated that the TSM containing the cobalt performed better than that expected for Mo-Ni-Au TSM, which is not wire-bondable with thin (0.25μ or less) gold top layers.

While the cobalt-containing TSM has chip pull strength and wire bond strength similar to Mo-Ni-Au TSM, it is nevertheless expected to perform better than the Mo-Ni-Au TSM due to the presence of cobalt which has less reactivity with the solder. Accordingly, the formation of detrimental intermetallics is less likely to occur.

Further, the use of cobalt as the barrier layer allows successful wire bonding to a TSM with a thin (0.25μ or less) top gold layer unlike the conventional nickel barrier TSM which requires a much thicker (greater than 1μ) top gold layer. In other words, the use of cobalt as the barrier layer allows a thin layer of gold to be used for both the solder bondable and wire bondable pads while the use of nickel as the barrier layer allows a thin layer of gold for the solder bondable pads but requires a thick layer of gold for the wire bondable pads. Thus, the reduction in gold thickness on the TSM according to the invention can lead to significant cost savings and process simplification due to having the same TSM on both solder bondable pads and wire bondable pads.

The invention has been described in great detail with respect to its preferred use in conjunction with ball limiting metallurgy and top surface metallurgy. It should be understood that the invention has application to other bonding arrangements as well. Among these are: bottom surface metallurgy (BSM); tape automated inner or outer lead bonding; thermo compression bonding of leads; direct attachment of the chip to organic substrates; or any application involving the joining of electronic components where an effective reaction and/or diffusion barrier is desired.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayered metallurgical structure for an electronic component comprising:
   (a) a base metallurgy comprising a first layer selected from the group consisting of chromium, titanium, tantalum, zirconium, hafnium, molybdenum and mixtures thereof and then a conductive layer selected from the group consisting of copper, aluminum and mixtures thereof directly on said first layer; and
   (b) a layer of cobalt directly on said conductive layer of said base metallurgy layer.

2. The structure of claim 1 wherein said first layer of said base metallurgy layer is chromium or titanium and said conductive layer of said base metallurgy layer is copper.

3. The structure of claim 1 further comprising a quantity of solder in contact with said layer of cobalt.

4. The structure of claim 1 further comprising a silicon device wherein said base metallurgy layer is on said silicon device.

5. The structure of claim 1 further comprising a ceramic substrate wherein said base metallurgy layer is on said substrate.

6. A multilayered metallurgical structure for an electronic component comprising:
   (a) a base metallurgy layer comprising a layer selected from the group consisting of titanium and chromium and then a layer of copper;
   (b) a layer of cobalt directly on said layer of copper; and
   (c) a layer of noble or relatively noble metal directly on said layer of cobalt.

7. The structure of claim 6 wherein said noble or relatively noble metal is selected from the group consisting of gold, platinum, palladium, tin and mixtures thereof.

8. The structure of claim 7 wherein said noble or relatively noble metal is gold.

9. The structure of claim 6 further comprising a silicon device wherein said base metallurgy layer is on said silicon device.

10. The structure of claim 6 further comprising a ceramic substrate wherein said base metallurgy layer is on said substrate.

11. A solder-contacted multilayered metallurgical structure for an electronic component comprising:
    (a) a base metallurgy layer comprising a layer selected from the group consisting of titanium and chromium and then a layer of copper;
    (b) a layer of cobalt directly on said layer of copper; and
    (c) a layer of noble or relatively noble metal directly on said layer of cobalt;
    (d) a quantity of solder in contact with said layer of noble or relatively noble metal.

12. The structure of claim 11 wherein said noble or relatively noble metal is selected from the group consisting of gold, platinum, palladium, tin, and mixtures thereof.

13. The structure of claim 12 wherein said noble or relatively noble metal is gold.

14. The structure of claim 11 further comprising silicon device wherein said base metallurgy is on said silicon device.

15. The structure of claim 11 further comprising a ceramic substrate wherein said base metallurgy is on said substrate.

16. The structure of claim 11 wherein said layer of noble or relatively noble metal, upon contact with said quantity of solder, becomes absorbed within the solder and thus is fugitive.

* * * * *